(12) United States Patent
Carter

(10) Patent No.: US 6,785,872 B2
(45) Date of Patent: Aug. 31, 2004

(54) ALGORITHM-TO-HARDWARE SYSTEM AND METHOD FOR CREATING A DIGITAL CIRCUIT

(75) Inventor: Richard J. Carter, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 216 days.

(21) Appl. No.: 10/051,078

(22) Filed: Jan. 22, 2002

(65) Prior Publication Data

US 2003/0145304 A1 Jul. 31, 2003

(51) Int. Cl.[7] ............................................. G06F 17/50
(52) U.S. Cl. ............................................. 716/3; 716/19
(58) Field of Search .............................. 716/3, 19, 1, 18

(56) References Cited

U.S. PATENT DOCUMENTS

| | | | |
|---|---|---|---|
| 5,603,043 A | * | 2/1997 | Taylor et al. .................. 712/1 |
| 6,078,736 A | | 6/2000 | Guccione ............... 395/500.17 |
| 6,226,776 B1 | * | 5/2001 | Panchul et al. ................. 716/3 |
| 6,230,307 B1 | * | 5/2001 | Davis et al. .................. 716/16 |
| 6,233,540 B1 | * | 5/2001 | Schaumont et al. .......... 703/14 |
| 6,513,144 B1 | * | 1/2003 | Kim et al. ...................... 716/4 |
| 6,545,501 B1 | * | 4/2003 | Bailis et al. .................. 326/10 |
| 6,584,601 B1 | * | 6/2003 | Kodosky et al. ............... 716/4 |

* cited by examiner

*Primary Examiner*—Stacy A. Whitmore

(57) ABSTRACT

A system and method is provided for creating a digital circuit, such as a configured FPGA or a VLSI chip. User code includes algorithm specifications having precisely defined operators and variables, data representation specifications and data communication specifications. The user code is compiled to create a digital circuit. For example, the compiled user code is used to generate either a hard-wired digital circuit or the configuration instructions for configuring a re-configurable digital circuit.

33 Claims, 8 Drawing Sheets

ALGORITHM-TO-HARDWARE SYSTEM AND METHOD FOR CREATING A DIGITAL CIRCUIT

FIELD OF THE INVENTION

This invention relates to creating a digital circuit. More particularly, the invention relates to converting an algorithm rendered in a programming language into an actual hardware implementation consisting of the digital circuit.

BACKGROUND OF THE INVENTION

Various persons have previously attempted to address the long-felt need for an easy approach to creating hardware designs. The prior art evidences two divergent approaches for designing actual implementations of digital hardware.

One prior art approach recognizes that the development of digital hardware would be available to a wider population if hardware designs could be rendered in a standard high-level programming language, which is more universally known, easier to use, and more frequently employed than HDLs. One such high-level programing language is ANSI C. Others, many of which have several extensions, are: APL, Ada, Algol, B, Basic, Kernighan & Ritchie C, C++, CLOS, COBOL, Clu, Common Lisp, Coral, Dylan, Eiffel, Emacs Lisp, Forth, Fortan, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

Prior art attempts to base computer aided hardware design tools on high-level programing languages have generally suffered from a number of shortcomings. In order to represent an algorithm in a high-level language, the designer must typically sacrifice direct control over the circuits generated by the associated design tools. Because the high-level language has no mechanism to represent specially constructed adders, multipliers and the like, the resulting tool-generated circuit typically has poor performance relative to what a hardware designer could achieve given the same algorithm. Furthermore, the tool-generated circuits may be inefficiently large compared to a human-designer created circuit. This results from the fact that hardware generated using prior art computer aided hardware design tools is typically based on simple line-by-line, table-driven translation and lacks the global optimizations that can be perceived by the human designer. In addition, the high-level language may lack the ability to specify non-standard sized registers, bit-serial communication paths and other design constructs known to produce smaller designs. Finally, in an attempt to approach human-designer quality results, the user of the high-level language based toolset might have to resort to a much lower-level algorithm specification, thus sacrificing the clarity of representation that is a primary benefit of this prior art toolset.

The inability of the prior art to generate efficient circuits is further illustrated by the following example. In this example, an algorithm to sum ten numbers is considered. An important aspect of the numbers to be summed in this example is that they represent student exam scores and can assume values in the range of 0 to 100 inclusive. The maximum value of the exam score total, which is specified to be the sum of ten exam scores, is thus 10*100=1000. This algorithm, coded in the high-level conventional C-language, is as follows:

```
/* source code A */
unsigned char exam_scores[10];
unsigned short total_exam_scores( ) {
   unsigned short total=0;
   unsigned int i;
   for (i=0;i<10;i++)
      total+=exam_scores[i];
   return total;
}
```

FIG. 7 shows a digital circuit 700 that may be generated by inputting the source code A into a prior art compiler. In this and subsequent circuit diagrams, a clocked register is denoted by a rectangular box with a double line at its input and with the $\Delta$ symbol inside to denote a delay of one clock cycle. Furthermore, in circuit 700 and subsequent circuit diagrams, only the datapath logic is shown, with control logic like clocking and memory address sequencing omitted for the sake of clarity. In the source code A, an 8-bit "unsigned char" is used for the "exam_scores" variable, since "unsigned char" is the smallest data type available in C that can still hold the maximum exam score of 100. A 16-bit "unsigned short" is used for the "total" variable, since this is the smallest data type that can hold the maximum exam score total of 1000. Based on this coding, a prior art compiler would generate the circuit 700 consisting of an 8-bit wide exam score memory 710, a 16-bit adder 720 and a 16-bit "total" register 730. The circuit 700, however, is far larger than optimal, because the smallest available variable sizes are larger than necessary, which results in an inefficient hardware realization.

A high-level language, i.e., PASCAL, provides the ability by way of its scalar subrange data types to specify a variable's set of assumable values, and hence its bit-width, with greater specificity than the conventional C-language. However, PASCAL has not been implemented in an algorithm-to-hardware toolset to provide optimal circuit configurations. Because of these listed shortcomings, the attempts at creating an effective tool for designing hardware using a high-level programming language have not achieved widespread use.

A second prior art approach to creating designs for digital hardware has been to create a specific hardware description language (HDL). Various commercially available HDLs have been developed, such as Verilog, VHDL, ABEL, CUPL, AHDL, MACHX, and PALASM. After a hardware design is rendered in an HDL, the HDL design is processed into a gate-level or cell-level netlist representation using one of various hardware or manufacturer-specific synthesis programs to interpret the HDL design. Then, the netlist representation is reduced to an actual hardware realization using conventional physical design tools.

HDLs and their associated computer-aided design tools have been created to be used by hardware designers and require a level of expertise in the use of the particular HDL being employed to render a hardware design. Because HDLs are difficult to learn and use, only persons who frequently design hardware typically use them. If a circuit application arises in which an HDL-representation of the algorithm is justified, the vast majority of persons must retain an expert or confront the difficult task of learning an HDL. Furthermore, these HDLs are not typically universal for the design of all target hardware technologies, since many HDLs are supported by only a single or a limited number of hardware manufacturers. Consequently, even experienced users of an HDL may not be sufficiently familiar with other HDLs to be able to render a design that can be implemented in a variety of hardware systems from a number of different hardware manufacturers.

HDLs permit a much more detailed control over the resulting hardware implementation, but often by sacrificing the clarity and supportability of the algorithm. To further illustrate this shortcoming of conventional HDLs, the previous problem of summing 10 exam scores is reconsidered. In an attempt to create a more efficient hardware realization, the algorithm specification is modified by including a language-feature present in prior art HDLs such as Verilog and VHDL, namely the ability to specify exact bit-widths of variables. Using one of a number of possible syntaxes, an integer variable whose value representation is constrained to exactly N bits is defined using the datatype "intN". The revised algorithm for summing ten exam scores is coded in the source code B as follows:

```
/* source code B */
unsigned int7 exam_scores[10];
unsigned int10 total_exam_scores( ) {
   unsigned int10 total=0;
   unsigned int i;
   for (i=0;i<10;i++)
      total +=exam_scores[i];
   return total;
}
```

The source code B uses the added bit-width language feature to specify a smaller size for the "exam_scores" and the "total" variables. In particular, a 7-bit integer type "unsigned int7" is the smallest data type available that can hold the maximum exam score of 100. Similarly, an "unsigned int10" is the smallest data type that can hold the maximum exam score total of 1000. Based on this coding, a prior art compiler would generate a circuit as shown in FIG. 8 consisting of a 7-bit wide exam score memory 810, a 10-bit adder 820 and a 10-bit "total" register 830. The reduced size circuit 800 represents an improvement over the circuit 700 (FIG. 7), because the circuit 800 is optimized for the data to be summed and is thus smaller. This improvement, however, comes at a price. First of all, the burden of calculating the proper bit-width of the variables has been forced on the user, and there is certainly the possibility of miscalculation. In addition, the relationship between the required bit-width of the "total" variable and the number and maximum value of the exam scores is lost. For example, assume that an exam is subsequently created that has a 10-point extra credit question. A support engineer directed to update source code B might inspect the program and conclude that it requires no changes, since the 7-bit "exam_score" width is sufficient to hold the new larger maximum of 110. However, circuit 800 would fail to calculate the proper total value in all circumstances, since the new maximum 10-exam total is 1100, which exceeds the value that can be held by the 10-bit total register 830. Thus, the use of the bit-width language feature present in many conventional HDLs can obscure important variable relationships in an algorithm and can lead to programming errors.

SUMMARY OF THE INVENTION

In one respect, the invention includes a method of converting code to a hardware realization. The method comprises steps of receiving user code including at least one algorithm specification, at least one data representation specification, and at least one data communication specification; and compiling the user code, wherein the user code is used to create a digital circuit.

In another respect, the invention includes another method of converting code to a hardware realization. The method comprises steps of receiving user code; identifying variables used in an operation in the user code, the operation including at least one operator, identifying a set of assumable values for each of the identified variables; calculating a set of assumable values for other variables holding the results of the operation based on the identified set of assumable values; and compiling the user code, wherein the user code is used to create a digital circuit.

In yet another respect, the invention includes a system operable to create a digital circuit. The system comprises a compiler compiling user code, the user code including at least one algorithm specification, at least one data representation specification, and at least one data communication specification; and a digital circuit created based on the compiled user code.

The methods of the invention include steps that may be performed by computer-executable instructions executing on a computer-readable medium.

One embodiment of the present invention includes the independence of an algorithm description from the implementation-specific details of data representation and communication. As a hardware designer explores the implementation design space (e.g., generates various hardware realizations to produce an optimal hardware realization), the designer is not required to completely recode and obscure the algorithm to force the compiler to generate the specific structures that support a particular choice of data representation and communication.

Other certain embodiments of the present invention include the ability to precisely specify the set of assumable values for variables (i.e., the variable's assumable value set) and automatically deduce the assumable value set for some variables. Those skilled in the art will appreciate these and other aspects of various embodiments of the invention upon reading the following detailed description with reference to the below-listed drawings.

BRIEF DESCRIPTION OF THE DRAWINGS

The present invention is illustrated by way of example and not limitation in the accompanying figures in which like numeral references refer to like elements, and wherein.

DETAILED DESCRIPTION OF THE INVENTION

In the following detailed description, numerous specific details are set forth in order to provide a thorough understanding of the present invention. However, it will be apparent to one of ordinary skill in the art that these specific details need not be used to practice the present invention. In other instances, well known structures, interfaces, and processes have not been shown in detail in order not to unnecessarily obscure the present invention.

Figure 1:
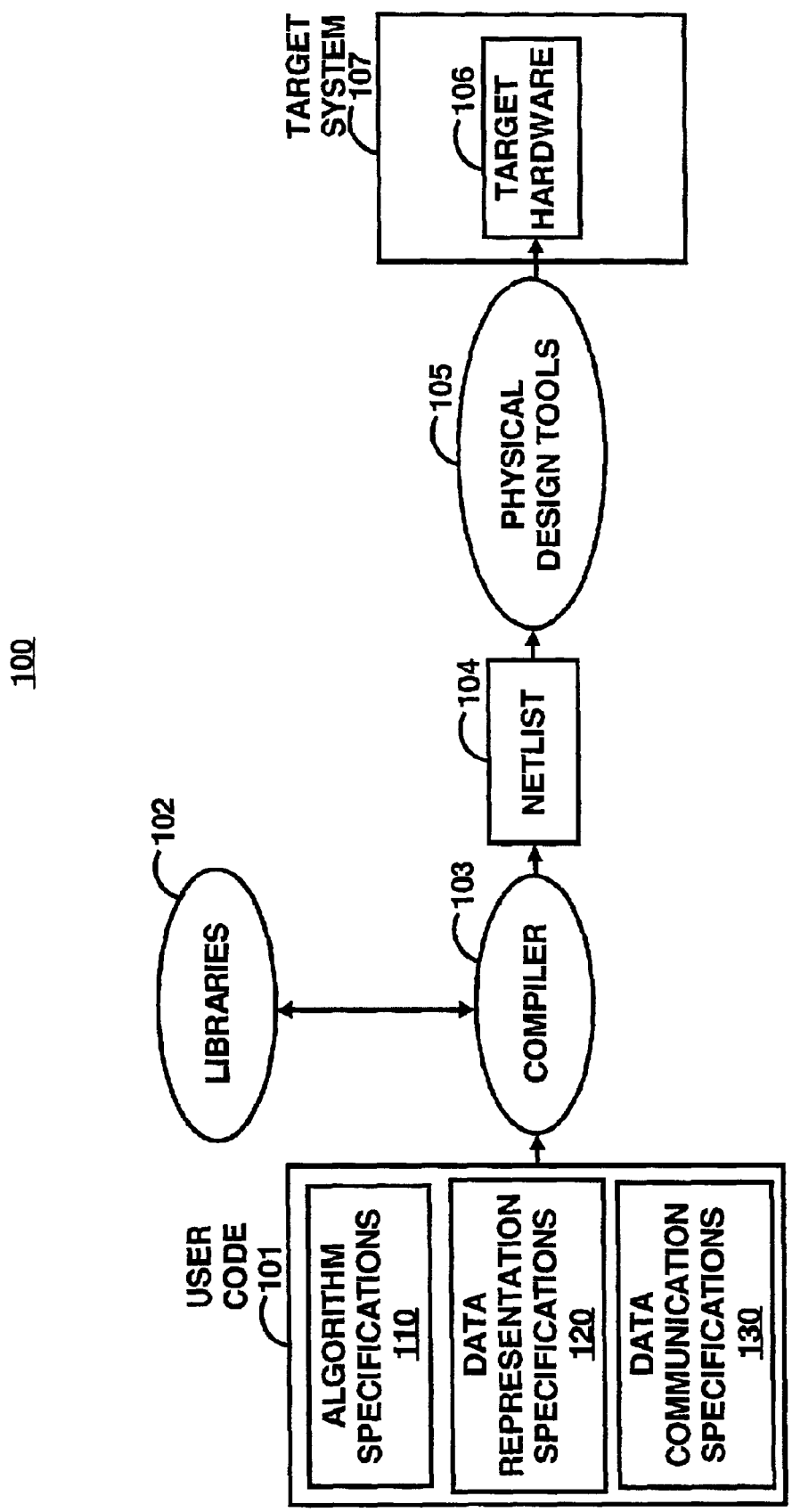
FIG. 1 illustrates an exemplary system employing principles of the invention.

FIG. 1 illustrates an exemplary algorithm-to-hardware system 100 of the invention. As shown in FIG. 1, the user code 101 is entered. The user code 101 includes a high-level description that can be used to determine a configuration for the target hardware 106. The target hardware 106 may include any configurable digital circuit, such as an FPGA, or any hard-wired digital circuit, such as a custom designed VLSI chip. The target hardware 106 may be used in a target system 107, which can include processor(s), and the like. The user code 101 may include algorithm specifications 110, data representation specifications 120 and data communication specifications 130. The user code 101 uses a programming language, which may be JAVA-like, C-like, etc., but that is enhanced to support the specifications of the invention. A compiler 103 combines the specifications from the user code 101 with the circuit descriptions from the library elements called from the libraries 102 to generate a netlist 104. The system 100 may be implemented on a variety of platforms (e.g., personal computer, server, and the like) and with a variety of operating systems. The physical design tools 105 take a logical representation of a structural design from the netlist 104 and map it to a specific hardware realization.

The algorithm specifications 110 describe variables and operators that may be included in the user code 101 for configuring the target hardware 106. The variables may be described by a set of unambiguous assumable values (i.e., an assumable value set). Operators are fully specified over the domain of their inputs and have a well-defined output range.

A variable's assumable value set, for example, may be described as a range of data values, rather than a C-language type representation (e.g., int i), where the range of represented values for "int i" is different from platform-to-platform. For example, the variable definition "int my_exam_score(0 . . . 100)" describes a variable that can assume only integer values from 0 to 100 inclusive.

The compiler 103 may also include the ability to automatically calculate an assumable value set for a variable as illustrated by the following example:

int a(0 . . . 255), b(0 . . . 255);

int c;

c=a+b;

The compiler 103 calculates that the variable "c" can assume values in the range of 0 to 510, based on the value sets specified for the "a" and "b" variables, the behavior of the "+" operator and the presence of the "c=a+b" statement.

As a result of this tightly specified or calculated value set of a variable, different register sizes or operator sizes may be realized. For example, instead of using traditional 16-bit or 32-bit registers, a 9-bit register or adder may be optimal for a particular algorithm. A variable having a range of $2^9$ values, from 0 to 511 inclusive, may be defined by the programmer in the user code 101, and a 9-bit register (e.g., for a 2's-complement data representation) may be realized through the compiler 103. A variable's assumable value set is not limited to a range of continuous numbers however. For example, a value set may be defined as consisting of the integer sequence 2, 4, 6 . . . 20 (e.g., exemplary syntax for defining a value set having non-continuous numbers may be "int d(2,4, . . . ,20)").

In the algorithm specifications 110, operators are defined over the domain of their inputs and have an unambiguous output range. An example of ambiguous output range, which may not be used for operators, would be the C-language sequence:

int i=−1;

int j=i>>1;

where the right-shift operator ">>" is left unspecified in C and may either be a signed or unsigned shift. As a result, the most significant bit of the "j" variable value is ambiguously either a "0" or a "1". Operators of the invention may include, but are not limited to, assignment, addition, subtraction, multiplication, division, and the like.

The data representation specifications 120 allow a user to choose how a variable is represented. For example, the variable "int a(0 . . . 255)" may be represented variously as 2's-complement, signed-digit, fully-redundant "carry-save", or the like. In an embodiment, an editor based on a graphical user interface (GUI) is provided for editing source code. For example, data representation information may be displayed in a color different from the remaining source code or as part of a pop-up, dialog window. Data representation knowledge for multiple types of data representations may be stored as library elements in the libraries 102. A user may select a particular data representation, and the library element associated with the selected data representation is retrieved from the libraries 102 and used to compile the user code 101. This permits a user to leave the algorithm part of the solution untouched (i.e. the algorithm source code files) and experiment with different hardware realizations through different data representations.

The data communication specifications 130 allow a user to select for each variable in the algorithm a data communication implementation. The data communication specification provides the technique for connecting hardware in the hardware realization and may include conventional connection techniques (e.g., bit-serial, digit-serial, fully-parallel, and the like). For example, bit-serial includes a single data line connecting hardware elements, while fully-parallel includes multiple data lines connecting hardware elements. Library elements representing an implementation for each data communication specification may be stored in the libraries 102. The user may select a particular data communication specification through an editor (e.g., a GUI-based editor or other conventional-type editor), and the library element associated with the selected data communication specification is retrieved from the libraries 102 and used to compile the user code 101. Similarly to the data representation specification 120, a user may leave the algorithm part of the source code untouched and experiment with different hardware realizations through different data communication specifications.

Because of the independence of the algorithm, data representation and data communication specifications, the algorithm specifications 110 could be debugged once and left in a natural human-readable form. Any further experimentation with data representation and data communication may be performed without subsequently re-introducing bugs or clouding the algorithm. This represents a significant advantage over conventional systems.

The system 100 is not limited to creating a single type of target hardware 106. The system 100 is operable to create the configuration instructions for one or more FPGAs or other types of re-configurable circuits. However, the system 100 is not limited to creating the configuration instructions for re-configurable circuits, and the system 100 is additionally operable to create a chip fabricated using custom-VLSI, standard-cell or other conventional specifications, and the like.

In one embodiment of the invention, the system 100 includes the ability to automatically assign a value set in the algorithm specifications 110. In the prior art example including the source code B, the programmer defined the bit-width for each of the variables. This burden on the programmer may lead to improperly assigned bit-widths if the programmer doesn't properly readjust the bit-width for a variable affected by an algorithm change or a bit-width change of another variable. To illustrate this further, in the algorithm of source code B, assume that an exam is subsequently created that has a 10-point extra credit question. A programmer might inspect the program and conclude that it requires no changes, since the 7-bit "exam_scores" width is sufficient to hold the new larger maximum of 110. However, the new maximum 10-exam total is 1100, which exceeds the value that can be held by the 10-bit total. Therefore, the programmer must inspect the remaining variables to insure that enough bit-width is specified.

The following example includes source code C and illustrates language and compiler features of the invention. This example demonstrates variables having both explicitly specified and compiler calculated value sets:

```
/* source code C */
unsigned int(0 . . . 100) exam_scores[10];
unsigned int total_exam_scores( ) {
    unsigned int total=0;
    unsigned int i;
    for (i=0;i<10;i++)
        total+=exam_scores[i];
    return total;
}
```

The data type of the "exam_scores" variable in source code C is an array of "unsigned int(0 . . . 100)". From this, the compiler understands that the value set for each exam score, (e.g., "exam_scores[0]") is the set of integers from 0 to 100 inclusive. However, the value set for the "total" variable is left unspecified in source code C. As a significant aspect of the invention, the compiler 103 is able to automatically calculate that the maximum value for the "total" variable is 10*100=1000. Thus, a 10-bit adder and a 10-bit total register would be generated by the invention compiler, which would support a sufficiently large maximum value of 1023.

The ability of the compiler 103 to conclude that the maximum value for the "total" variable is 1000 is based on the value set for the "exam_scores" variable. To illustrate how the compiler 103 automatically calculates the value set for the "total" variable, the loop in the source code C is "unrolled" by the compiler 103 as part of the compilation process to form the equivalent internal representation:

```
unsigned int(0 . . . 100) exam_scores[10];
unsigned int total_exam_scores( ) {
    unsigned int total1, total2, total3, total4, total5,
        total6, total7, total8, total9, total10;
    total1=0+exam_score[0];
    total2=total1+exam_score[1];
    total3=total2+exam_score[2];
    total4=total3+exam_score[3];
    total5=total4+exam_score[4];
    total6=total5+exam_score[5];
    total7=total6+exam_score[6];
    total8=total7+exam_score[7];
    total9=total8+exam_score[8];
    total10=total9+exam_score[9];
    return total10;
}
```

The compiler 103, based on the "+" operator as set forth by this embodiment of the invention, understands that "total1" has a value set of (0 . . . 100), that "total2" has a value set of (0 . . . 200), and finally that "total10" has the value set of (0 . . . 1000). Note that the "total" variable definition specifies no strict set of values in the original program. Instead, the compiler 103 calculates the value set of some variables (e.g., "total") based on the properties of the operators that determine the variable value and the input value set of the variables feeding those operators. This allows the "total10" variable (and hence the return type of the total_exam_scores( ) function) to be sized by the compiler to the minimum theoretical bit-width of 10-bits, without any explicit user coding. The advantage of this is seen by considering the scenario of increasing the maximum exam score to 110. The user would indicate this by changing the exam score definition to "unsigned int(0 . . . 110) exam_scores[10]". Based on this, the compiler 103 automatically calculates the new maximum exam score total to be 10*110=1100 and sizes the "total" register and the adder that feeds it to be 11 bits wide. Therefore, an automatic and bug-free sizing of variables is facilitated.

Figure 2:
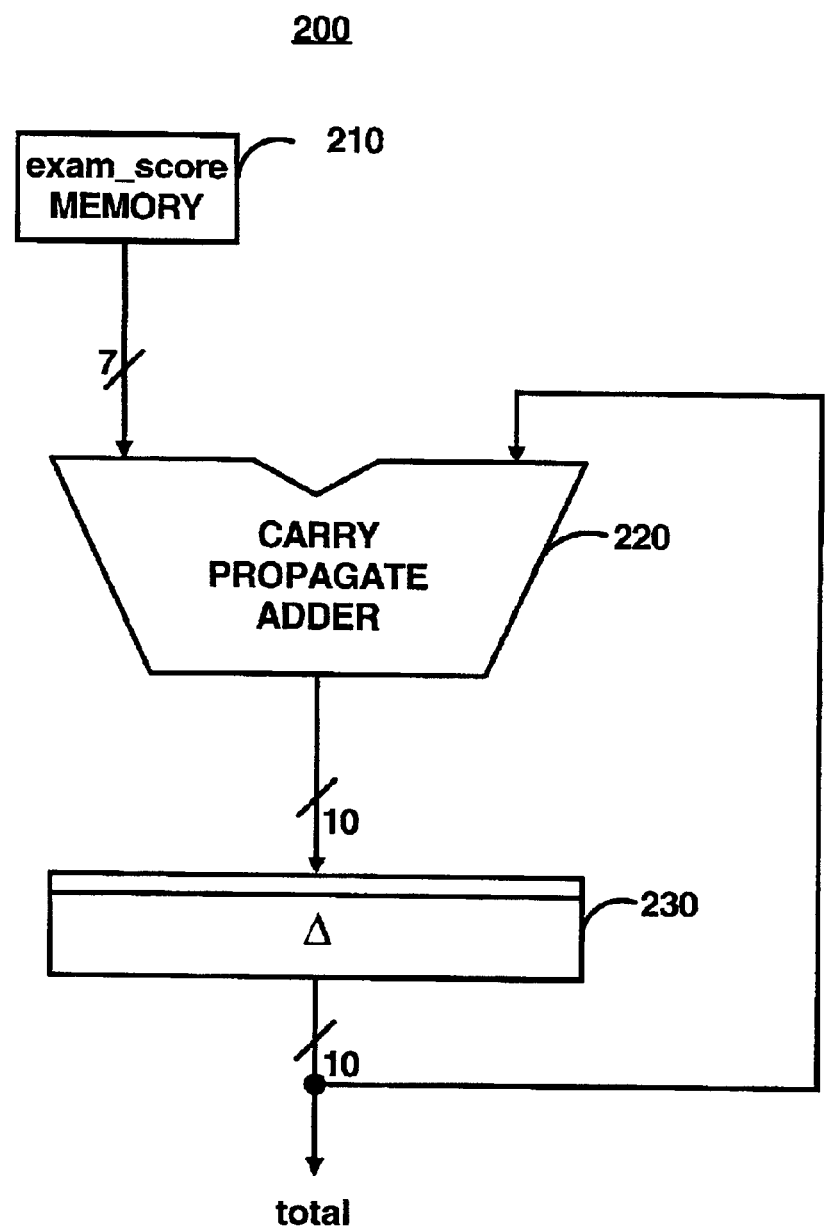
FIG. 2 illustrates a circuit generated by a compiler of the invention.
Figure 8:
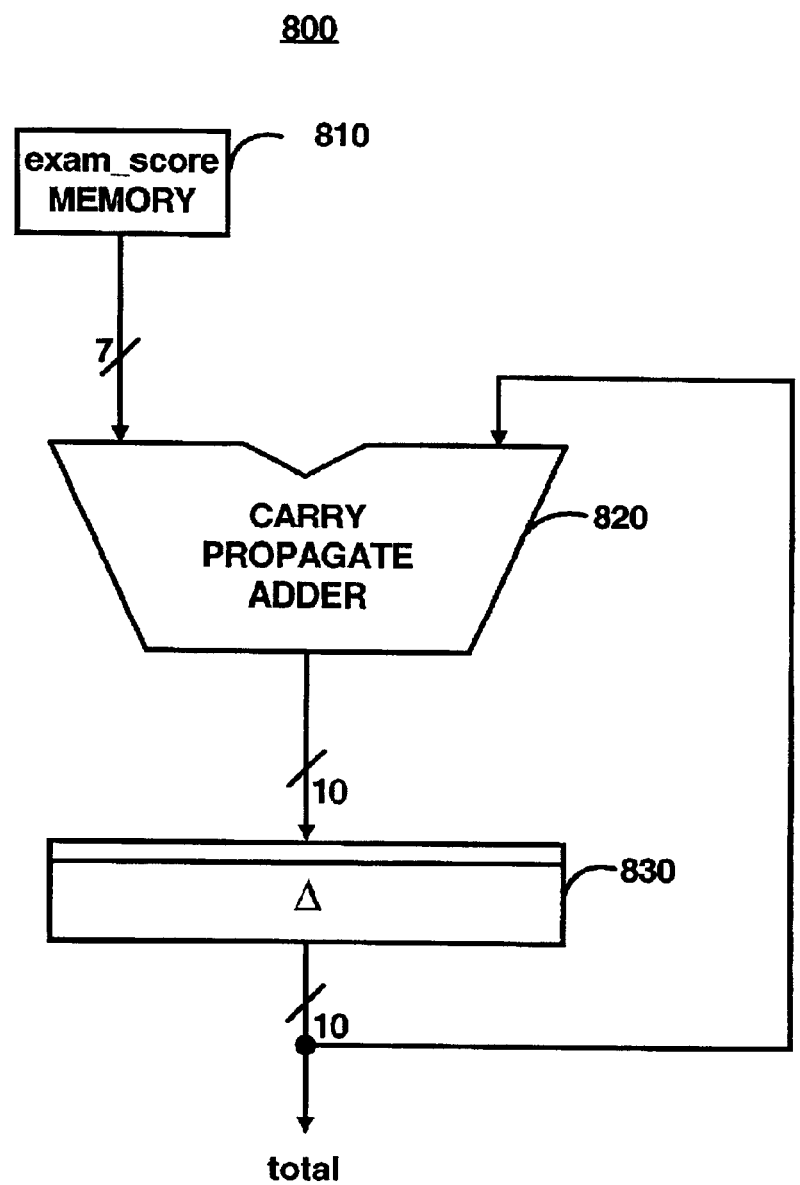
FIG. 8 illustrates another circuit as might be generated by a prior art compiler.

FIG. 2 illustrates an example of a circuit 200 generated using the system 100 with source code C as the algorithm specifications 110. The circuit 200 includes a 7-bit wide exam score memory 210, a 10-bit adder 220 and a 10-bit "total" register 230. Note that the circuit 200 is identical to the circuit 800, shown in FIG. 8. Therefore, the system 100 is operable to generate a circuit as least as efficient as the prior art and with minimal error prone techniques forced on the programmer. In this example, source code C has not been explicitly augmented with any specification for the data representation or data communication. In this case, the default settings set up within the compiler (e.g., 2's complement, fully-parallel) would come into force to supply these specifications.

In the following source code D, data representation specifications are shown:

```
/* source code D */
total_exam_scores( )=carrySave;
total=carrySave;
exam_scores=twosComplement;
i=twosComplement;
```

Specifically, the "total" variable and the "total_exam_scores" function return type are both specified to be in the fully redundant "carrySave" form. This then permits the compiler 103 to replace the carry-propagate adder 220 (FIG. 2) with a carry-save adder 320 in the resulting implementation, shown in FIG. 3. The "exam_scores" and "i" variables are specified to be in the "twosComplement" form.

Figure 3:
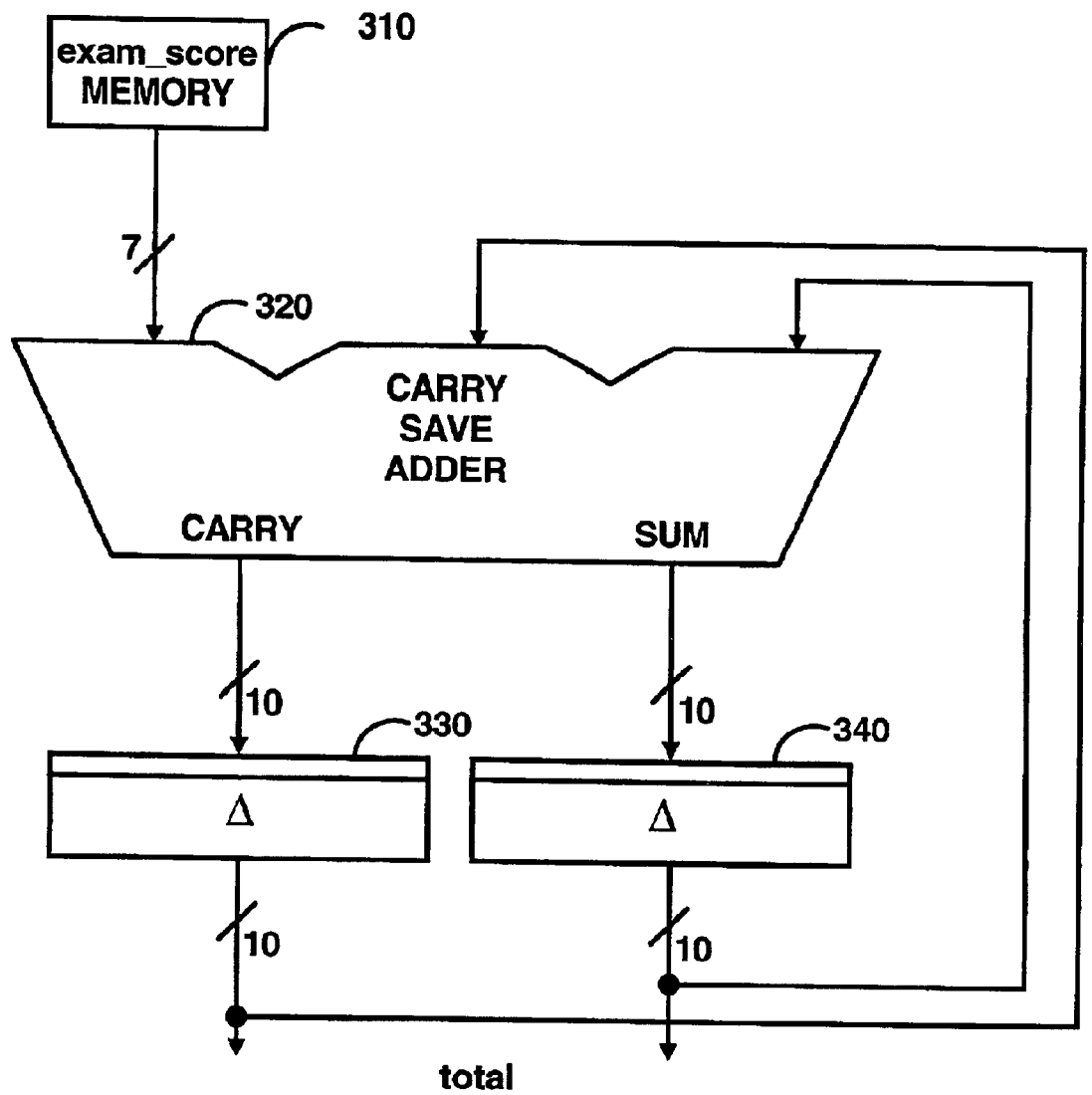
FIG. 3 illustrates another circuit generated by a compiler of the invention.

FIG. 3 illustrates a circuit 300 that is an implementation of the exam score algorithm of source code C when coupled with the data representation specifications of source code D. Source code C and source code D have not been explicitly augmented with any data communication specification, so the default settings set up within the compiler (e.g., fully-parallel) would come into force to supply these specifications. The circuit 300 includes a 7-bit wide exam score memory 310, the carry-save adder 320 and 10-bit "total" registers 330 and 340. The carry-save adder 320 has no carry-chain logic, which results in a smaller input-to-output logic delay. Thus, the circuit 300 can operate at a much higher clock frequency than the circuit 200. This improved data throughput is achieved by the implementation space exploration made possible by an embodiment of the invention. Note also that an alternate data representation can be specified without modifying the algorithm source.

In the following source code E, data communication specifications are shown:

/* source code E */
total_exam_scores=serial, LSDFirst, digitSize=1;
total=serial, LSDFirst, digitSize=1;
exam_scores=parallel;
i=parallel;

Specifically, the "total" variable and the "total_exam_scores" function return type are both specified to have the data communication specification of "serial, LSDFirst, digitSize=1". This is a more formal description of what is commonly termed "least-significant-bit-first bit-serial data communication". This specification instructs the compiler 103 to replace the parallel carry-propagate adder 220 or the carry-save adder 320 with a single-bit-wide full adder 430 (shown in FIG. 4) in the resulting implementation.

Figure 4:
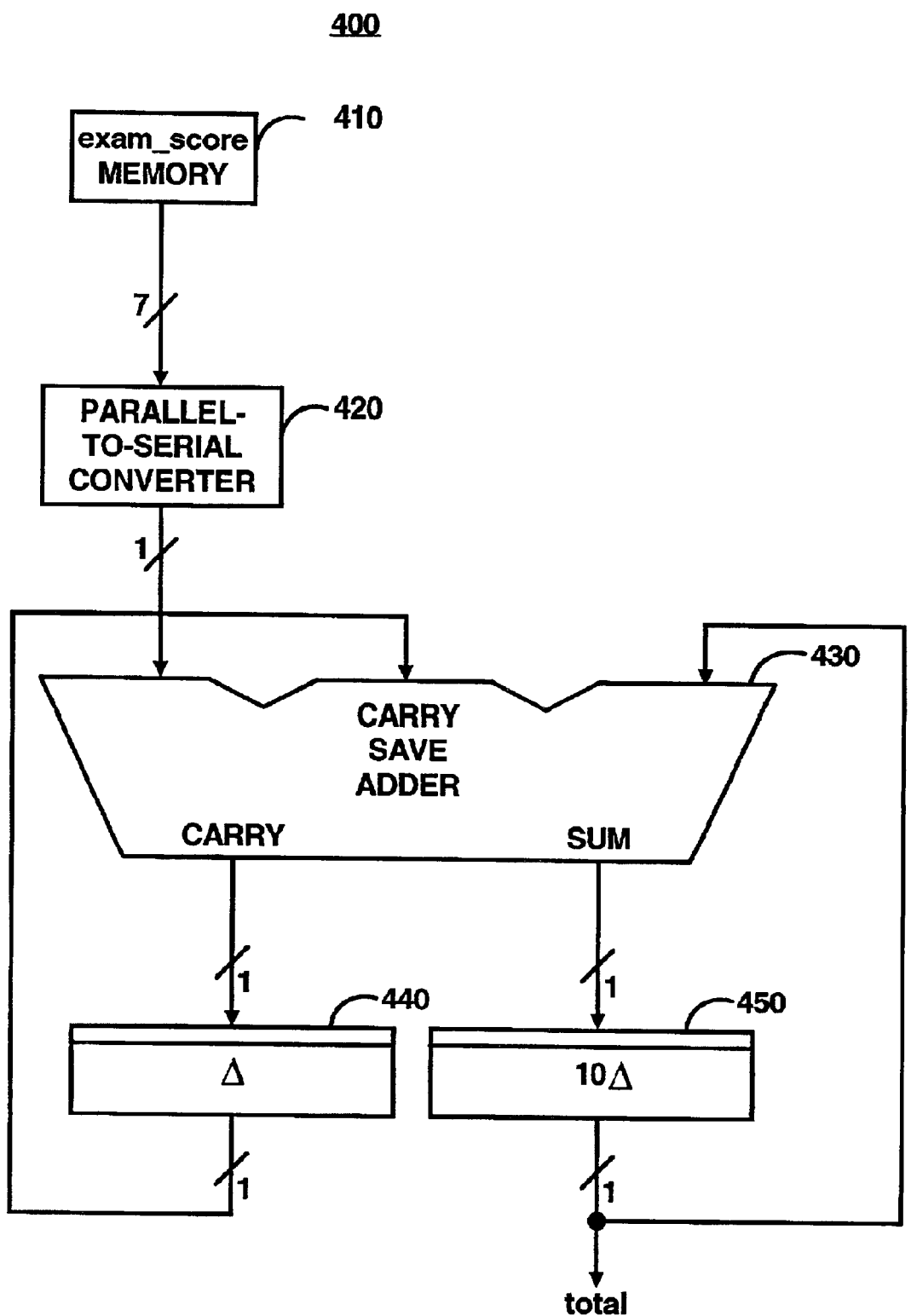
FIG. 4 illustrates another circuit generated by a compiler of the invention.

FIG. 4 illustrates a circuit 400 as a resulting implementation of the exam score algorithm of source code C when coupled with the data communication specification of source code E. Source code C and source code E have not been explicitly augmented with any data representation specification, so the default settings set up within the compiler (e.g., 2's complement) would come into force to supply these specifications. The circuit 400 includes a 7-bit wide exam score memory 410, a parallel-to-serial converter 420, the carry-save adder 430, the 10-bit "total" serial shift register 450, and a 1-bit "carry out" register 440. The "total" value held in the 10-bit serial shift register 450 appears at the output serially, least-significant-bit first, over the course of 10 clock cycles. The trade-offs and advantages of a bit-serial implementation are well known to hardware designers. In general, bit-serial designs have very high clock-rates and very small combinatorial logic overhead. Throughput is often divided by some integral factor, but this degradation can sometimes be offset by multiple copies of the bit-serial circuit. Through an embodiment of the invention then, bit-serial and alternate data communication methods can be specified without modifying the algorithm source. Accordingly, different data communication implementations may be explored simply by modifying only the data communication specifications 130 of the user code 101.

It will be apparent to one of ordinary skill in the art that the system 100 encompasses each of the algorithm specifications 110, the data representation specifications 120 and the data communications specifications 130, and these specifications may not be incorporated as distinct text files or in a particular type of editor. Also, data representation and data communication specifications for every variable may not necessarily be explicitly included in user code 101, and default values can be used by the compiler 103 in such cases.

Figure 5:
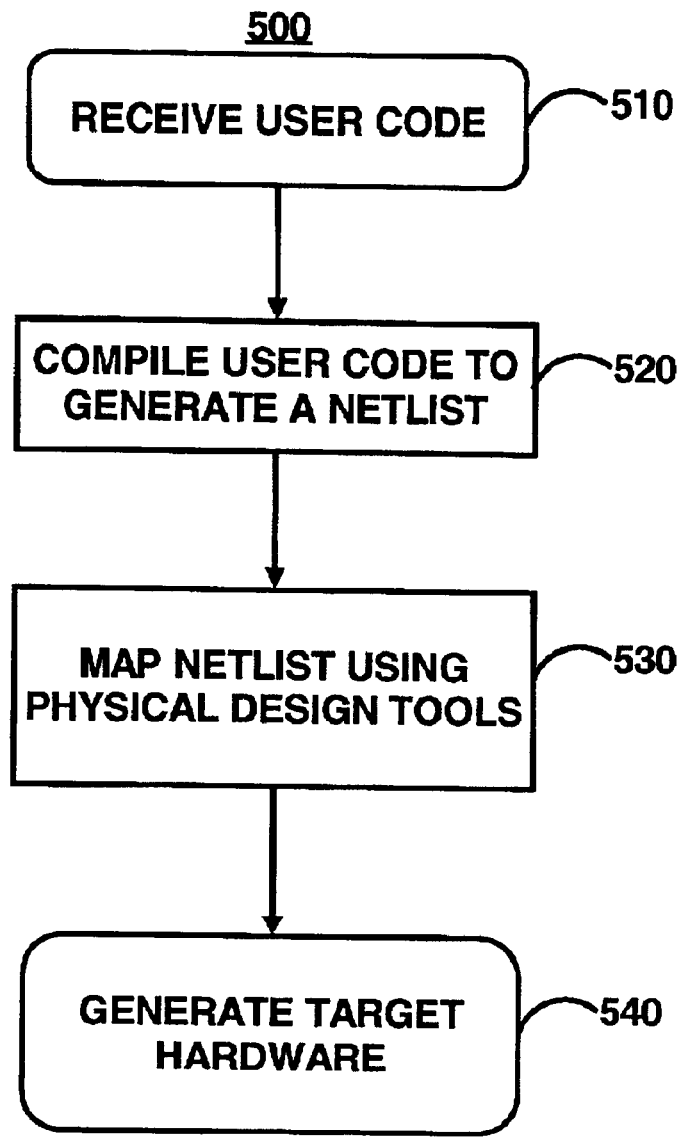
FIG. 5 illustrates an exemplary method employing principles of the invention.

FIG. 5 illustrates an exemplary method 500 that may be facilitated using the system 100 shown in FIG. 1. In step 510, the user code 101 is received by the compiler 103. The user code 101, for example, is generated by a programmer and includes the algorithm specifications 110, the data representation specifications 120 and the data communication specifications 130. For example, the algorithm specifications 110 include variables and operators of the invention.

The data representation specifications are selected by the user and received by the compiler 103. For example, through an editor, the user selects how each variable is represented. The variables may default to one type (e.g., 2's-complement), but the user may select other representations (e.g., signed-digit, fully-redundant carry-save, or the like). The editor may include a GUI-based editor that displays variables in different colors (e.g., one color for each representation type), or as part of a pop-up, dialog window. Other conventional-type editors may be used. The selections are received by the compiler and used during compiling of the user code 101.

The data communication specifications are selected by the user and received by the compiler 103. For example, through an editor, the user selects a data communication specification for each variable. The specification may default to one type (e.g., fully-parallel), but the user may select other specifications (e.g., digit-serial, bit-serial, and the like). A GUI-based editor or other conventional-type editor may be used to select a specification. The selected specification is received by the compiler and used during compiling of the user code 101.

In step 520, the user code 101 is compiled to generate the netlist 104. This includes retrieving library elements associated with the selected data representation specifications, the selected data communication specifications and hardware elements (e.g., registers, adders, multipliers, and the like). The user code 101 is compiled with the retrieved library elements.

In step 530, the physical design tools 105 map the logical representation of the structural design provided by the netlist 104 to a form suitable for directly generating a hardware realization for the target hardware 106.

In step 540, the target hardware 106 is generated and may be implemented in the target system 107.

It will be apparent to one of ordinary skill in the art that the user code 101 may be edited and re-compiled. Also, the method 500 is applicable for creating digital circuits other than those embodied by configured FPGAs and including circuits realized through other re-configurable devices, one-time programmable devices, etc. Also, the method 500 is applicable for creating the specification for a VLSI chip fabricated using custom design, standard-cell design, etc.

Figure 6:
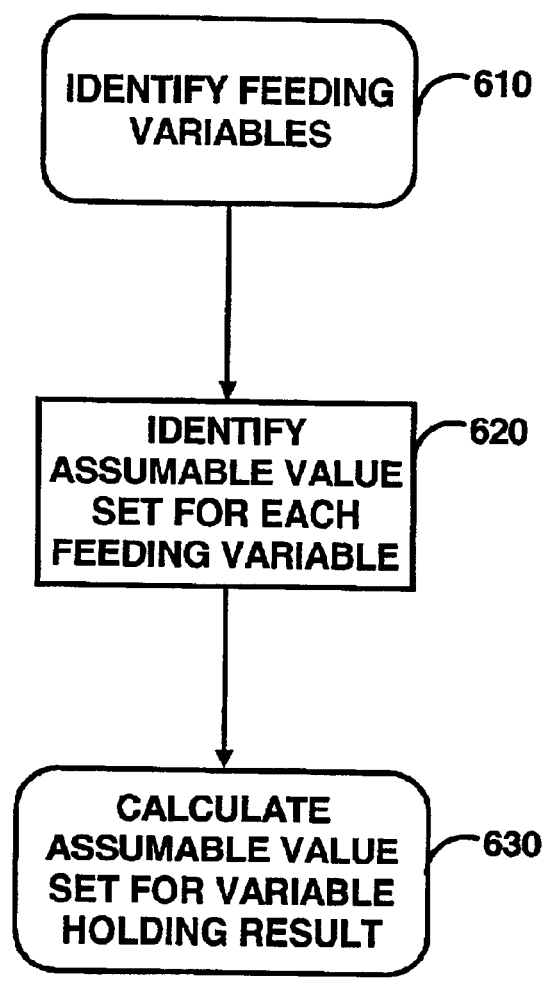
FIG. 6 illustrates another exemplary method employing principles of the invention.
Figure 7:
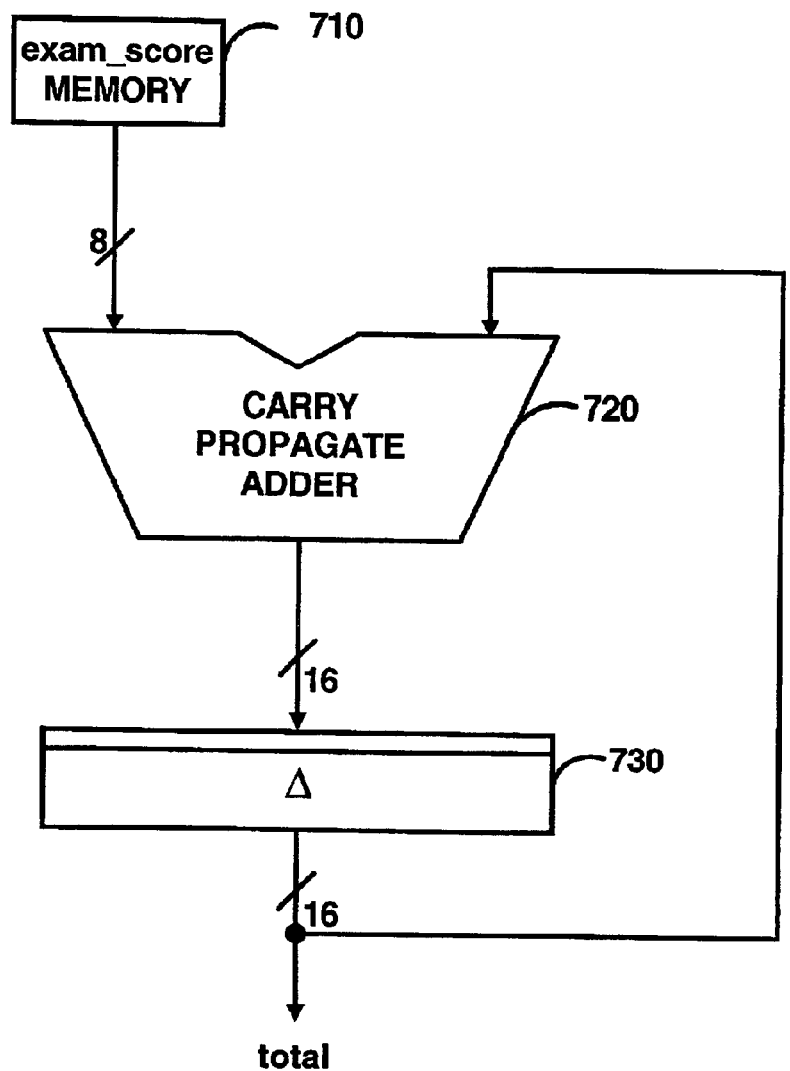
FIG. 7 illustrates a circuit as might be generated by a prior art compiler.

FIG. 6 illustrates an exemplary method 600 for facilitating automatic value set assignment for an operator result variable in the user code 101. In step 610, variables that feed an operator (e.g., feeding variables) for computing a result variable are identified. For example, in the source code F below, the "a" and "b" variables are feeding variables that feed the "+" operator whose result variable is "c".

/* source code F */
int a(0 . . . 255), b(0 . . . 255);
int c, d;
c=a+b;
d=c+b;

In step 620, the assumable value set for each of the feeding variables is identified. For example, the value set for "a" and "b" variables is the set of integers from 0 to 255 inclusive.

In step 630, the assumable value set for the variable holding the operator result is calculated. For example, the value set for the result of the "+" operator whose result is the "c" variable is calculated to be the set of integers from 0 to 510 inclusive.

The method 600 can be used iteratively on all the operators of a calculation in an order that permits all the initially unspecified variable value sets to be calculated. In the current example of source code F, now that the value set for the "c" variable is known, the value set for the "d" variable can be calculated by following the steps of method 600 as follows.

In step 610, the "c" and "b" variables are identified as the feeding variables that feed the "+" operator whose result variable is "d".

In step 620, the value set for the "b" variable is identified as being the set of integers from 0 to 255 inclusive. Based on the previous use of method 600, the value set for "c" variable is identified as being the set of integers from 0 to 510 inclusive.

In step 630, the assumable value set for the result of the "+" operator whose result is the "d" variable is calculated to be the set of integers from 0 to 765 inclusive.

The method 600 is not limited to sizing the variables in the code fragment shown or limited to computations with the "+" operator. It will be apparent to one of ordinary skill in the art that the method 600 may be used to size one or more variables that are the result of an operation.

The methods 500 and 600 can be performed by a computer program. The computer program can exist in a variety of forms both active and inactive. For example, the computer program and objects can exist as software comprised of program instructions or statements in source code, object code, executable code or other formats; firmware program (s); or hardware description language (HDL) files. Any of the above can be embodied on a computer readable medium, which include storage devices and signals, in compressed or uncompressed form. Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of executable software program(s) of the computer program on a CD ROM or via Internet download. In a sense, the Internet itself, as an abstract entity, is a computer readable medium. The same is true of computer networks in general.

While this invention has been described in conjunction with the specific embodiments thereof, it is evident that many alternatives, modifications and variations will be apparent to those skilled in the art. There are changes that may be made without departing from the spirit and scope of the invention.

What is claimed is:

1. A method of converting code to a hardware realization, the method comprising steps of:
   receiving user code including at least one algorithm specification, at least one data representation specification, and at least one data communication specification;
   compiling the user code, wherein the user code is used to create a digital circuit; and
   wherein the at least one algorithm specification, the at least one data representation specification, and the at least one data communication specification are independent and each of these specifications are modifiable without affecting the others.

2. The method of claim 1, wherein the step of compiling further comprises steps of:
   compiling the user code to generate a netlist; and
   mapping the netlist using physical design tools for creating the digital circuit.

3. The method of claim 1, further comprising a step of creating the digital circuit based on the user code.

4. The method of claim 3, wherein the step of creating further comprises steps of:
   creating configuration data; and
   subsequently configuring an FPGA.

5. The method of claim 3, wherein the step of creating further comprises creating a specification for one of a custom-designed VLSI chip and a standard cell VLSI chip.

6. The method of claim 1, wherein the step of compiling further comprises retrieving information from libraries, the information being associated with the at least one algorithm specification, the at least one data representation specification, and the at least one data communication specification.

7. The method of claim 1, wherein the at least one algorithm specification includes at least one variable having a defined set of values not varying by platform and at least one operator having a function not varying by platform.

8. The method of claim 1, wherein the at least one data representation specification includes one of 2's-complement, signed-digit, and fully-redundant carry-save for each variable in the at least one algorithm specification.

9. The method of claim 1, wherein the at least one data communication specification includes one of bit-serial, digit-serial and fully-parallel for each variable in the at least one algorithm specification.

10. The method of claim 1, wherein the step of receiving the user code further comprising receiving selections of the at least one algorithm specification, the at least one data representation specification, and the at least one data communication specification from a graphical user interface (GUI).

11. A method of converting code to a hardware realization, the method comprising steps of:
    receiving user code, wherein the user code is an expression of a design of a digital circuit;
    identifying variables used in an operation in the user code, the operation including at least one operator;
    identifying a set of assumable values for each of the identified variables;
    calculating a set of assumable values for other variables in the user code holding the results of the operation based on the identified set of assumable values; and
    compiling the user code.

12. The method of claim 11, wherein the user code further includes at least one algorithm specification, at least one data representation specification, and at least one data communication specification.

13. The method of claim 12, wherein the at least one data representation specification includes one of 2's-complement, signed-digit, and fully-redundant carry-save for each variable in the at least one algorithm specification.

14. The method of claim 12, wherein the at least one algorithm specification, the at least one data representation specification, and the at least one data communication specification are independent, such that each of these specifications are modifiable without affecting the others.

15. The method of claim 11, wherein the user code is programmed in a high level programming language.

16. The method of claim 15, wherein the high level programming language comprises one of a C-like and JAVA-like programming language.

17. A system operable to create a digital circuit from user code, the system comprises:
    a compiler compiling the user code, the user code including at least one algorithm specification, at least one data representation specification, and at least one data communication specification; wherein
    the at least one algorithm specification, the at least one data representation specification, and the at least one data communication specification are independent, such that each of these specifications are modifiable without affecting the others.

18. The system of claim 17, further comprising a plurality of libraries connected to the compiler, the plurality of libraries including information associated with the at least one algorithm specification, the at least one data representation specification, and the at least one data communication specification, wherein the compiler retrieves the information to compile the user code.

19. The system of claim 17, wherein the compiler compiles the user code to generate a netlist that lists components in the digital circuit.

20. The system of claim 19, further comprising physical design tools, the physical design tools being used to create the digital circuit from the netlist.

21. The system of claim 17, wherein the at least one algorithm specification includes variables and an operator in an operation in the user code, and each of the variables includes an identifiable set of assumable values to be used in the operation.

22. The system of claim 21, wherein the compiler is operable to calculate a set of assumable values for a variable in the operation performed by an operator holding a result of the operation based on the identified set of assumable values for the variables used in the operation.

23. A method of using software code to design a digital circuit, the method comprising:
    receiving high level programming language code representing an expression of a design of a digital circuit, wherein the code comprises:
        at least one algorithm specification including at least one variable and at least one operator;
        at least one data representation specification identifying a type of data representation for the at least one variable in the digital circuit; and
        at least one data communication specification identifying a data communication implementation in the digital circuit associated with the at least one variable;
    identifying variables used in an operation in the user code, the operation including the at least one operator;
    identifying a set of assumable values for each of the identified variables;
    calculating a set of assumable values for at least one other variable in the code holding a result of the operation based on the identified set of assumable values; and
    compiling the code, the compiled code being used to create the digital circuit.

24. The method of claim 23, wherein the high level programming language comprises one of a C-like and JAVA-like programming language.

25. The method of claim 23, wherein the at least one variable has a set of assumable values defined in the code.

26. The method of claim 23, wherein the at least one algorithm specification, the at least one data representation specification, and the at least one data communication specification are independent, such that each of these specifications are modifiable without affecting the others.

27. The method of claim 23, wherein the code identifies a defined set of values for the at least one variable that do not vary by platform.

28. Computer software embedded on a computer readable medium, the computer software comprising instructions performing:
    receiving user code including at least one algorithm specification, at least one data representation specification, and at least one data communication specification, wherein the at least one algorithm specification, the at least one data representation specification, and the at least one data communication specification are independent and each of these specifications are modifiable without affecting the others; and
    compiling the user code, wherein the user code is used to create a digital circuit.

29. The computer software of claim 28, further comprising instructions performing:
    identifying variables used in an operation in the user code, the operation including at least one operator;
    identifying a set of assumable values for each of the identified variables; and
    calculating a set of assumable values for other variables in the user code holding the results of the operation based on the identified set of assumable values.

30. The computer software of claim 28, wherein the user code is programmed in a high level programming language.

31. An apparatus comprising:
    means for receiving user code including at least one algorithm specification, at least one data representation specification, and at least one data communication specification, wherein the at least one algorithm specification, the at least one data representation specification, and the at least one data communication specification are independent and each of these specifications are modifiable without affecting the others; and
    means for compiling the user code, wherein the user code is used to create a digital circuit.

32. The apparatus of claim 31, further comprising:
    means for identifying variables used in an operation in the user code, the operation including at least one operator;
    means for identifying a set of assumable values for each of the identified variables; and
    means for calculating a set of assumable values for other variables in the user code holding the results of the operation based on the identified set of assumable values.

33. The apparatus of claim 31, wherein the user code is programmed in a high level programming language.

* * * * *